United States Patent
Zinober et al.

(10) Patent No.: US 8,511,168 B2
(45) Date of Patent: Aug. 20, 2013

(54) SENSOR ELEMENT FOR CAPACITIVELY MEASURING DIFFERENTIAL PRESSURE

(75) Inventors: Sven Zinober, Friolzheim (DE); Remigius Has, Grafenau Dätzingen (DE)

(73) Assignee: Robert Bosch GmbH, Stuttgart (DE)

( * ) Notice: Subject to any disclaimer, the term of this patent is extended or adjusted under 35 U.S.C. 154(b) by 205 days.

(21) Appl. No.: 13/191,118

(22) Filed: Jul. 26, 2011

(65) Prior Publication Data

US 2012/0024074 A1   Feb. 2, 2012

(30) Foreign Application Priority Data

Jul. 28, 2010   (DE) .......................... 10 2010 038 534

(51) Int. Cl.
*G01L 9/12*     (2006.01)
*G01L 9/00*     (2006.01)

(52) U.S. Cl.
USPC .......... 73/718; 73/724; 361/283.1; 361/283.4

(58) Field of Classification Search
USPC ..................................................... 73/700–756
See application file for complete search history.

(56) References Cited

U.S. PATENT DOCUMENTS

| | | | | |
|---|---|---|---|---|
| 5,259,247 A * | 11/1993 | Bantien | ........................... | 73/718 |
| 2003/0205090 A1 * | 11/2003 | Jakobsen | ........................ | 73/718 |
| 2004/0237658 A1 * | 12/2004 | Ohms et al. | ..................... | 73/718 |
| 2005/0076719 A1 * | 4/2005 | Jakobsen et al. | ................ | 73/718 |
| 2010/0170346 A1 * | 7/2010 | Opitz et al. | ..................... | 73/718 |

* cited by examiner

*Primary Examiner* — Andre Allen
(74) *Attorney, Agent, or Firm* — Kenyon & Kenyon LLP

(57) ABSTRACT

A capacitive differential pressure sensor is described which has a simple configuration, and which provides reliable measuring results even in corrosive measuring environments. The sensor element for capacitively measuring differential pressure includes a sensor diaphragm which is implemented in a layered configuration on a semiconductor substrate and spans a cavern. A pressure connection opens into the cavern. The sensor element also includes a measuring capacitor which has a movable electrode on the sensor diaphragm, and a stationary counter electrode which is situated on the base of the cavern, opposite from the movable electrode. According to the sensor, the cavern is filled with a dielectric fluid.

5 Claims, 6 Drawing Sheets

SENSOR ELEMENT FOR CAPACITIVELY MEASURING DIFFERENTIAL PRESSURE

RELATED APPLICATION INFORMATION

The present application claims priority to and the benefit of German patent application no. 10 2010 038 534.4, which was filed in Germany on Jul. 28, 2010, the disclosure of which is incorporated herein by reference.

FIELD OF THE INVENTION

The present invention relates to a sensor element for capacitively measuring differential pressure, having at least one sensor diaphragm which is implemented in a layered configuration on a semiconductor substrate and spans a cavern, having at least one pressure connection which opens into the cavern, and having at least one measuring capacitor which includes at least one movable electrode on the sensor diaphragm and at least one stationary counter electrode which is situated on the base of the cavern, opposite from the movable electrode.

BACKGROUND INFORMATION

Micromechanical pressure sensors are used in machine construction, process measurement engineering, automotive engineering, and in medical technology for numerous measuring tasks. Special measures must usually be taken for use in a corrosive measuring environment in order to ensure functionality of the sensor. In addition to the micromechanical sensor structure, it is also necessary in particular to protect the electrical circuit elements for signal detection and the connections for signal pickup, and for power supply. It is known to use gels to protect exposed metal surfaces such as bond pads, for example. In the case of pressure sensors which are used in the exhaust gas region of motor vehicles, lime-filled gels, for example, are used. The lime neutralizes the acidic exhaust gases, thus preventing corrosion of the nonprecious metal surfaces. Another option for protecting the sensor element from harmful environmental influences lies in complex packaging. Corrosion of circuit parts as well as deposition of dirt particles on the sensor structure may be prevented in this way.

Sensor elements which operate according to the piezoresistive principle are often used in practice for detecting differential pressure. These sensor elements generally include only one sensor diaphragm, which may be acted on both sides by the two measuring pressures to be compared. If there is any dependency at all of the measuring results on absolute pressure, in this measuring system it is very slight, since both measuring pressures act on the same sensor diaphragm. The resistor elements for signal detection are generally situated in the regions of maximum expansion of the diaphragm surface, so that without additional protective measures they come into contact with one of the two measuring media.

In addition, sensor elements for detecting differential pressure are known which operate capacitively. In this measuring concept it is absolutely essential to prevent penetration of dirt particles into the sensor structure, since such soiling distorts the measuring results. For this purpose, the electrodes of the measuring capacitor or the interspace between the measuring electrodes within the sensor structure is/are hermetically sealed so that they do not come into contact with any of the measuring media. As a result, the construction of these sensor elements is very robust, but as a rule is much more complex than that of sensor elements which operate according to the piezoresistive principle.

SUMMARY OF THE INVENTION

The exemplary embodiments and/or exemplary methods of the present invention provides a capacitive differential pressure sensor which has a simple configuration, and which provides reliable measuring results even in corrosive measuring environments.

The media resistance required for this purpose is achieved by filling the cavern of a sensor element of the type mentioned at the outset with a dielectric fluid.

Accordingly, the sensor element according to the present invention includes only one sensor diaphragm, which is acted on both sides by the two measuring pressures to be compared. The sensor diaphragm may be rectangular or circular, or may also have any other shape which fits with the particular sensor configuration. One measuring pressure acts on the top side of the diaphragm, while the other measuring pressure acts via a pressure connection into the cavern beneath the diaphragm, and therefore is conducted to the back side of the diaphragm. In this sensor configuration the force acting on the diaphragm corresponds to the pressure difference to be detected, regarding both direction and magnitude. Therefore, the pressure conditions may be determined very accurately, even at high absolute pressures but at a low pressure difference.

Signals are detected with the aid of a measuring capacitor whose electrodes are situated on the cavern wall, namely, on the bottom side of the diaphragm and on the cavern base. According to the exemplary embodiments and/or exemplary methods of the present invention, the cavern is filled with a dielectric fluid which transmits the pressure of the measuring medium directly to the bottom side of the diaphragm. Since the cavern is open, temperature-related changes in the volume of the fluid have no appreciable effect on the measuring results. The fluid protects the electrodes of the measuring capacitor from corrosion since the measuring medium is not able to pass into the cavern. In addition, the fluid prevents the penetration of dirt particles into the cavern, and thus, into the measuring capacitor.

In principle there are various options for implementing the sensor element according to the exemplary embodiments and/or exemplary methods of the present invention, regarding both the type of fluid and the sensor structure.

As previously mentioned, the fluid must be a nonvolatile dielectric which transmits the pressure pulse of the measuring medium to the sensor diaphragm with as little loss as possible. These requirements are met by polymers, for example. However, oils are also suitable. Since the fluid functions as a dielectric for the measuring capacitor, the sensitivity of the sensor element may be influenced by the selection of the fluid. In a micromechanical sensor structure, the dimensions of the cavern and in particular the distance between the sensor diaphragm and the cavern-base are generally such that the fluid is retained within the cavern due to capillary action, although the cavern is open. There is no concern for leakage of the fluid, since the surface forces which act in this case are stronger than the force of gravity. Within the scope of the exemplary embodiments and/or exemplary methods of the present invention, however, a fluid may also be used which assumes a gel-like consistency after the cavern is filled.

The larger the measuring signal for a given differential pressure, the greater the measuring accuracy of the sensor element. The electrodes of the measuring capacitor should therefore be located as close as possible to the middle region of the diaphragm and situated opposite same on the cavern base, since the middle region of the sensor diaphragm is always deflected most strongly. Accordingly, the greatest changes in capacitance are expected for this electrode system.

This electrode system may be easily implemented, for example, when the back-side pressure connection is provided parallel to the layer planes of the sensor element and open into the cavern from the side. However, in one variant of the exemplary embodiments and/or exemplary methods of the present invention the back-side pressure connection is provided inside the semiconductor substrate, so that the back-side pressure connection opens into the cavern base. In this case it has proven to be advantageous when the pressure connection opening is located in the cavern base beneath the edge region of the diaphragm, so that the cavern base is closed beneath the middle region of the diaphragm, and the electrodes of the measuring capacitor may be optimally situated in the middle region of the diaphragm and opposite same. For reasons of symmetry, multiple pressure connection openings may also be provided in the base of the cavern. In one particularly advantageous variant, the back-side pressure connection is composed of a gridlike system of pressure connection openings which extends over the entire cavern base, exactly in the same way as the counter electrode, which is perforated, in a manner of speaking, due to the pressure connection openings.

The capacitive detection of measured values of the sensor element according to the exemplary embodiments and/or exemplary methods of the present invention provides the option for receiving the measuring results in a contactless manner. For this purpose, the measuring capacitor is connected to a resonant circuit via at least one coil. The capacitance of the measuring capacitor varies as a function of the particular applied differential pressure. Accordingly, the resonance frequency of the resonant circuit changes, which may be easily detected by inductive means with the aid of a further coil.

As discussed above, there are various options for advantageously configuring and refining the teaching of the present invention. For this purpose, reference is made on the one hand to the description herein, and on the other hand to the following description of three exemplary embodiments of the present invention with reference to the figures.

DETAILED DESCRIPTION

Figure 1A:
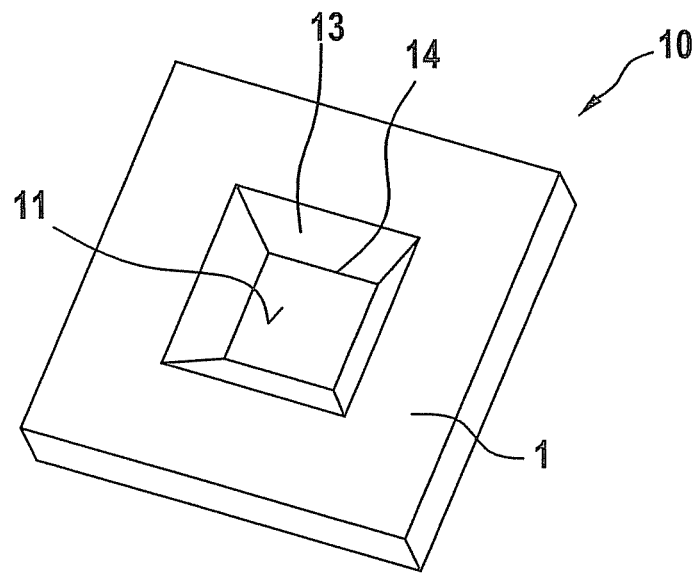
FIGS. 1a, 1b, and 1c show a first variant of a sensor element according to the present invention in two perspective illustrations and one schematic sectional illustration.
Figure 1B:
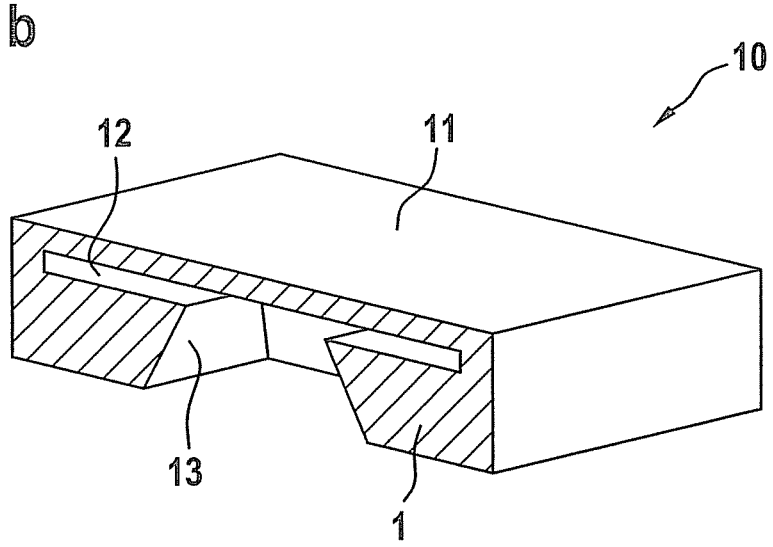

FIGS. 1a and 1b illustrate the micromechanical sensor structure of a first sensor element 10 according to the present invention for capacitively measuring differential pressure. FIG. 1a shows a perspective illustration of the back side of the component, while FIG. 1b shows a perspective sectional view of sensor element 10.

Sensor element 10 includes a square sensor diaphragm 11 which is implemented in a layered configuration on a semiconductor substrate 1 and spans a cavern 12. A back-side pressure connection 13, which in the present case has been produced using bulk micromechanical processes and which is recognizable by its truncated pyramidal shape, and which tapers toward sensor diaphragm 11, opens into cavern 12. Pressure connection 13 extends from the back side of the component and through the entire thickness of semiconductor substrate 1, and ends in a square pressure connection opening 14 in the cavern base, beneath the middle region of sensor diaphragm 11.

Figure 1C:
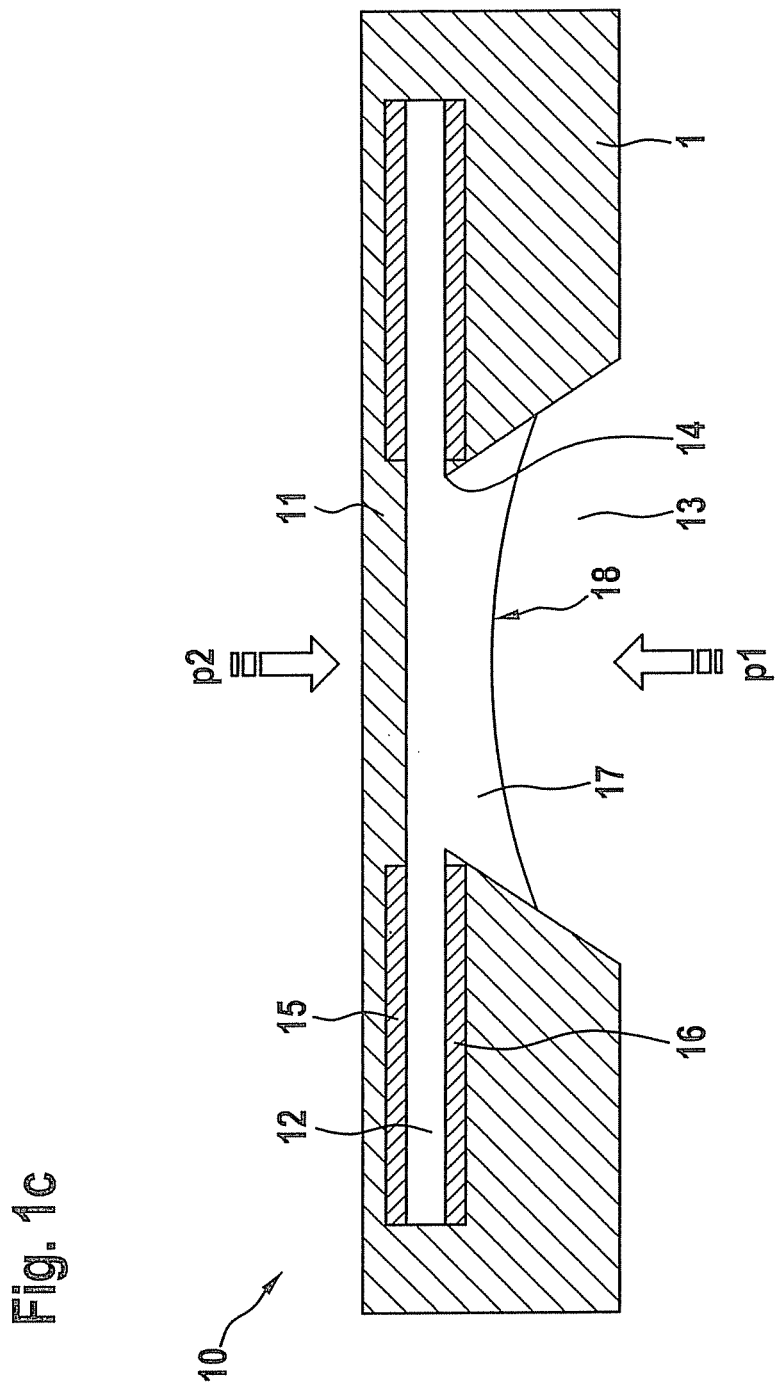

According to the sectional illustration of FIG. 1c, sensor diaphragm 11 functions as a support for a movable electrode 15 situated peripherally at the diaphragm edge. This movable electrode, together with a stationary electrode 16 which is oppositely situated on the cavern base, forms a measuring capacitor, electrode 16 bordering pressure connection opening 14. From a process engineering standpoint, these electrodes may be implemented in the form of local dopings which are electrically insulated from the surrounding semiconductor material via oxide layers. In principle, one measuring capacitor is sufficient for detecting a measuring signal. However, variants having multiple measuring capacitors, each composed of two oppositely situated electrodes in the edge region of the diaphragm or the pressure connection opening, are also conceivable.

According to the exemplary embodiments and/or exemplary methods of the present invention, cavern 12 is filled with a dielectric fluid 17 which is retained in cavern 12 due to capillary forces. The interfacial tension between fluid 17 and semiconductor substrate 1 results in formation of a meniscus 18 in the region of open pressure connection 13.

To illustrate the mode of operation of sensor element 10, in FIG. 1c the two pressures p1 and p2 to be compared are indicated by corresponding arrows. p2 acts directly on sensor diaphragm 11 in the top side of the component, while p1 is introduced into back-side pressure connection 13. p1 is transmitted without losses via fluid 17 to the back side of sensor diaphragm 11, so that the force acting on sensor diaphragm 11 corresponds to pressure difference p1−p2. If the two pressures p1 and p2 are equal to zero or are identical, there is a defined distance between the two electrodes 15 and 16 of the measuring capacitor which corresponds to an output capacitance $C_0$. This value may be specified by the sensor configuration, the shape and size of the electrodes, and the configuration of the electrodes. A pressure difference p1−p2 which is not equal to zero results in a deformation or deflection of sensor diaphragm 11. Corresponding to the distance between the two electrodes 15 and 16, the capacitance of the measuring capacitor changes, which is detected as a measuring signal.

Figure 2A:
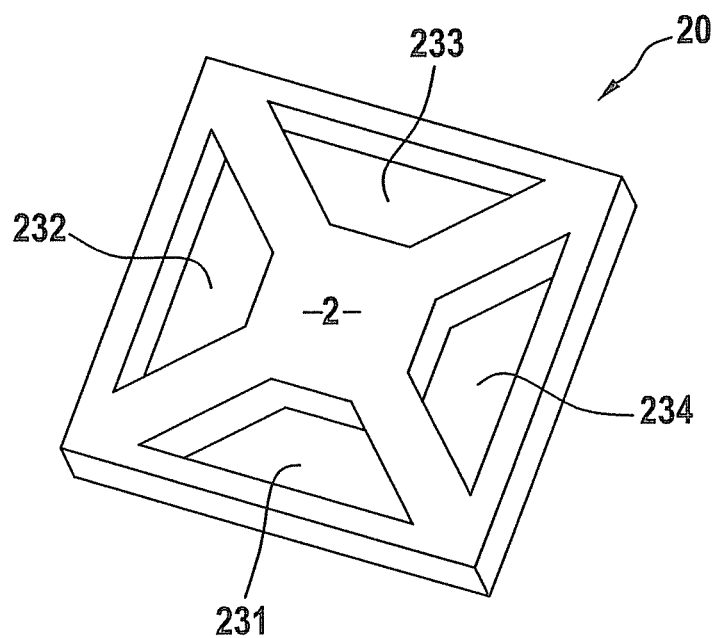
FIGS. 2a, 2b, and 2c show a second variant of a sensor element according to the present invention in two perspective illustrations and one schematic sectional illustration.
Figure 2B:
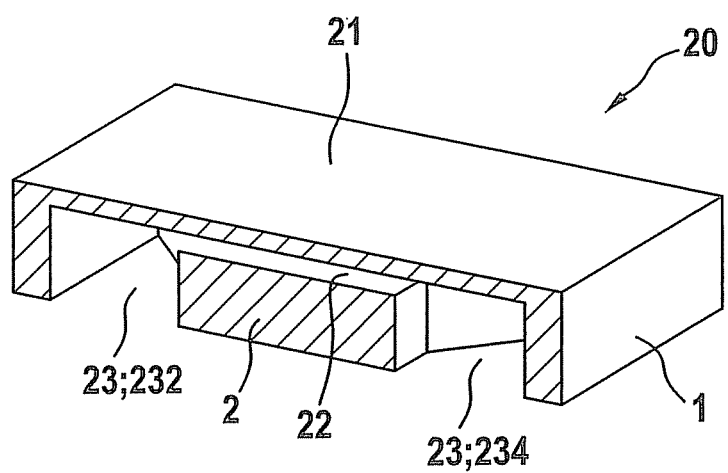
Figure 2C:
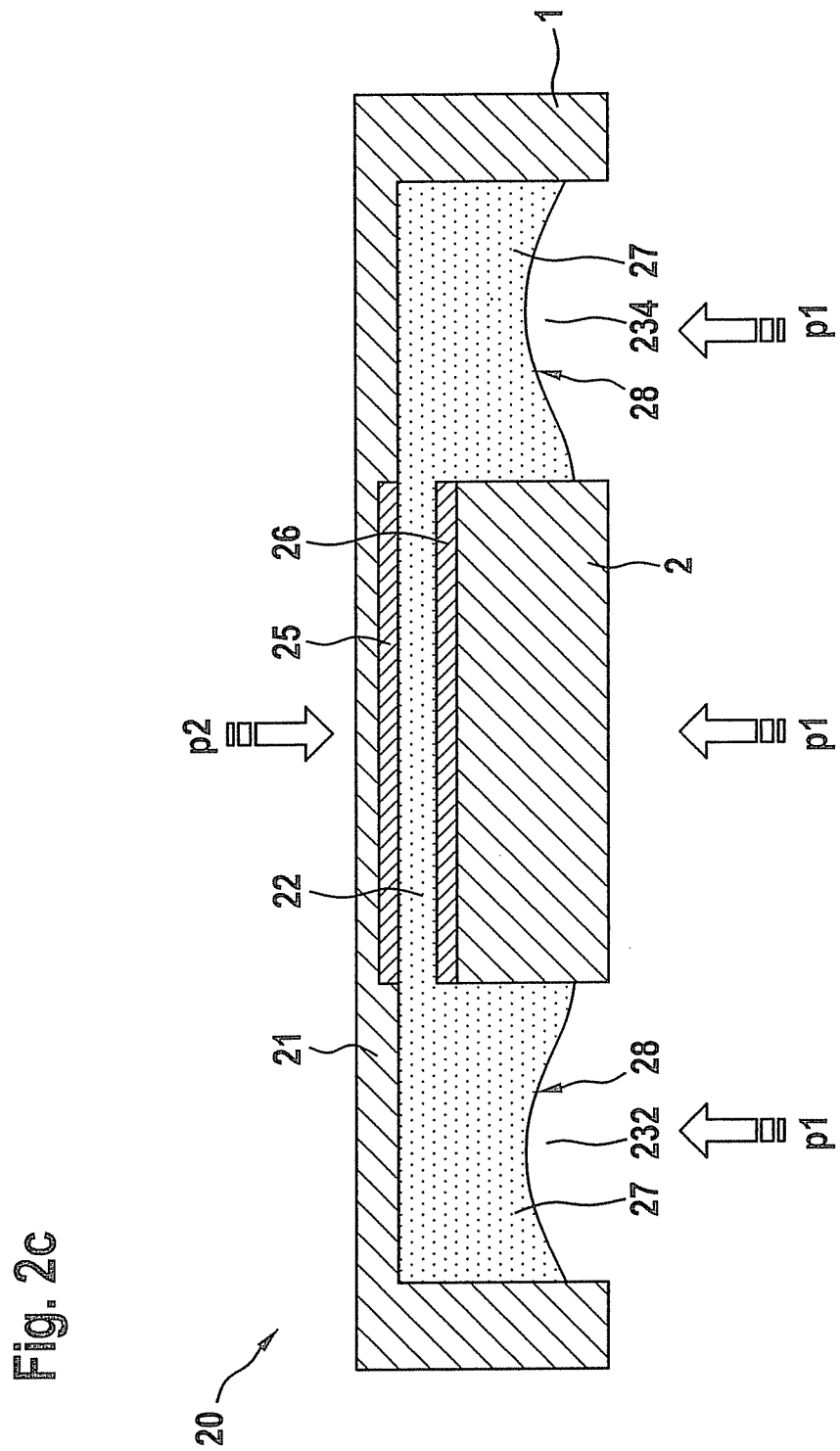

FIGS. 2a through 2c illustrate a sensor element 20 having a modified sensor structure which allows measuring electrodes 25 and 26 to be placed in the region of maximum change in distance, namely, in the middle region of diaphragm 21 and on the oppositely situated cavern base.

The same as sensor element 10, sensor element 20 also includes a square sensor diaphragm 21 which is implemented in a layered configuration on a semiconductor substrate 1 and spans a cavern 22. In the present case, however, back-side pressure connection 23 is implemented in the form of four trapezoidal openings 231 through 234 in semiconductor substrate 1 which are grouped symmetrically around a closed middle region 2 of semiconductor substrate 1. All four trapezoidal openings 231 through 234 extend from the back side of the component through the entire thickness of semiconductor substrate 1 and open into cavern 22, whose base is closed in the middle region corresponding to the shape and configuration of these trapezoidal openings 231 through 234.

This is illustrated in particular in FIG. 2a, in which the back side of the component is illustrated in a perspective view. However, the sensor structure described above is also shown in the perspective sectional view in FIG. 2b.

The same as in the case of sensor element 10, movable electrode 25 of the measuring capacitor is situated on the bottom side of sensor diaphragm 21, except that the movable electrode is in the middle region, which is deflected farthest from the neutral position when acted on by pressure. Stationary counter electrode 26 of the measuring capacitor is situated on closed middle region 2 of the cavern base, as illustrated in FIG. 2c. Here as well, cavern 22 is filled with a dielectric fluid 27 which is retained in cavern 22 due to capillary forces and which prevents the penetration of dirt particles into the sensor structure having the measuring capacitor. The interfacial tension between fluid 27 and semiconductor substrate 1 results in formation of menisces 28 in the region of trapezoidal openings 231 through 234. The mode of operation of sensor element 20 corresponds to that of sensor element 10.

Figure 3A:
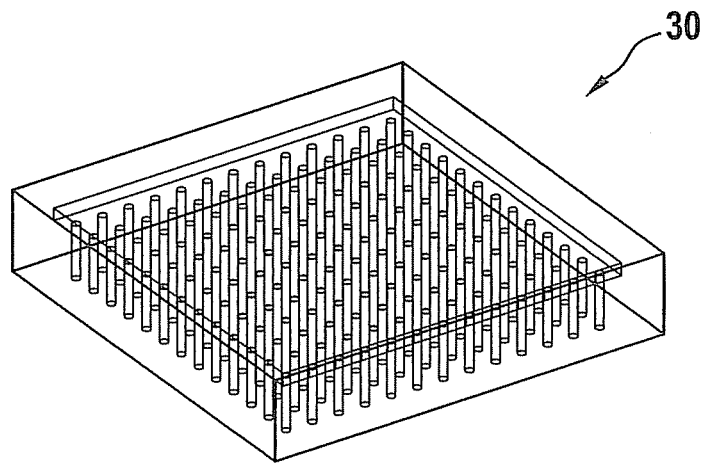
FIGS. 3a, 3b, and 3c show a third variant of a sensor element according to the present invention in two perspective illustrations and one schematic sectional illustration.
Figure 3B:
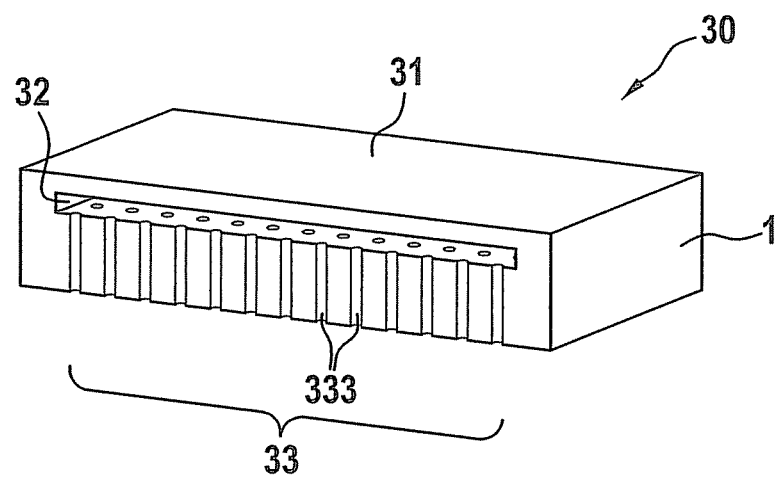
Figure 3C:
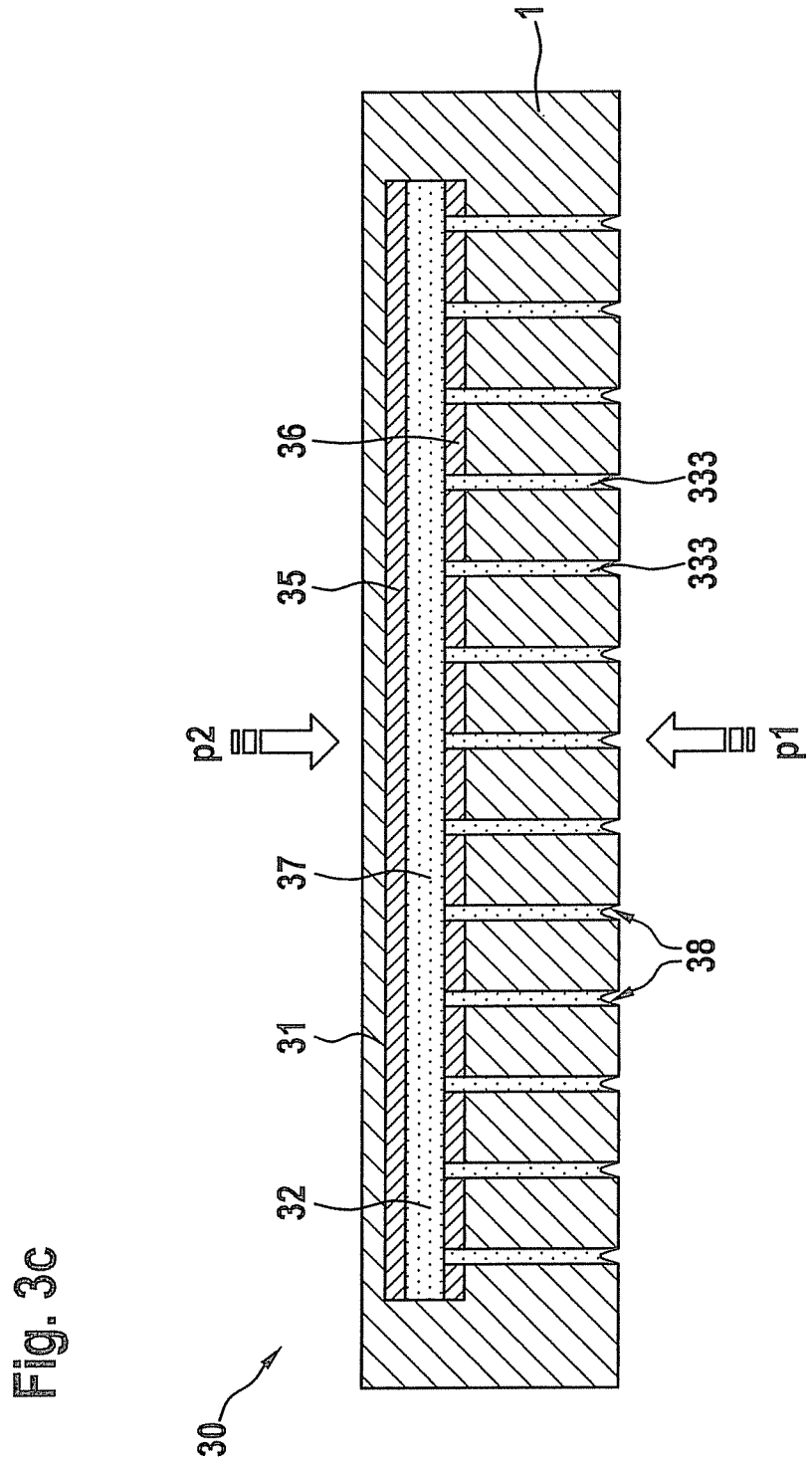

A sensor element 30 is illustrated in FIGS. 3a through 3c whose sensor structure allows even larger electrode surfaces to be achieved.

The perspective sectional view of FIG. 3b shows that sensor element 30 likewise includes a square sensor diaphragm 31 which is implemented in a layered configuration on a semiconductor substrate 1 and spans a cavern 32. In the present case, back-side pressure connection 33 is implemented in the form of a plurality of relatively small openings 333 arranged in a grid, this grid extending uniformly over the entire cavern base. The comparatively small size of grid openings 333 is also shown in the three-dimensional view in FIG. 3a.

In the case of sensor element 30, movable electrode 35 of the measuring capacitor extends over the entire diaphragm surface on the bottom side of sensor diaphragm 31, in the same way as counter electrode 36 extends over the entire surface of the cavern base. The relatively small grid openings 333 are dimensioned in such a way that they allow pressure to act on the back side of sensor diaphragm 31, but do not impair the capacitive detection of signals. This is illustrated in FIG. 3c. Here as well, according to the exemplary embodiments and/or exemplary methods of the present invention, cavern 32 is filled with a dielectric fluid 37. The interfacial tension between fluid 37 and semiconductor substrate 1 results in formation of menisces 38 in the region of grid openings 333. With regard to the mode of operation of sensor element 30, here as well reference is made to the corresponding description for sensor element 10.

What is claimed is:

1. A sensor element for capacitively measuring differential pressure, comprising:
    at least one sensor diaphragm which is implemented in a layered configuration on a semiconductor substrate and spans a cavern;
    at least one pressure connection which opens into the cavern; and
    at least one measuring capacitor which includes at least one movable electrode on the sensor diaphragm and at least one stationary counter electrode which is situated on the base of the cavern, opposite from the movable electrode;
    wherein the cavern is filled with a dielectric fluid.

2. The sensor element of claim 1, wherein the fluid is one of a polymer and an oil.

3. The sensor element of claim 1, wherein the at least one pressure connection opens into the cavern beneath the edge region of the diaphragm so that the base of the cavern is closed beneath the middle region of the diaphragm, and the electrodes of the measuring capacitor are situated in and beneath the middle region of the diaphragm.

4. The sensor element of claim 1, wherein there are multiple pressure connection openings in the base of the cavern.

5. The sensor element of claim 1, wherein the measuring capacitor is connected to at least one coil, and together with the at least one coil forms a resonant circuit for inductive signal pickup.

* * * * *